(12) United States Patent
Chen et al.

(10) Patent No.: US 9,679,813 B2
(45) Date of Patent: Jun. 13, 2017

(54) SEMICONDUCTOR STRUCTURE AND PROCESS FOR FORMING PLUG INCLUDING LAYER WITH PULLED BACK SIDEWALL PART

(71) Applicant: UNITED MICROELECTRONICS CORP., Hsin-Chu (TW)

(72) Inventors: Pin-Hong Chen, Yunlin County (TW); Kuo-Chih Lai, Tainan (TW); Chia Chang Hsu, Kaohsiung (TW); Chun-Chieh Chiu, Keelung (TW); Li-Han Chen, Tainan (TW); Shu Min Huang, Tainan (TW); Min-Chuan Tsai, New Taipei (TW); Hsin-Fu Huang, Tainan (TW); Chi-Mao Hsu, Tainan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 14/710,583

(22) Filed: May 12, 2015

(65) Prior Publication Data

US 2016/0336270 A1    Nov. 17, 2016

(51) Int. Cl.
| | | |
|---|---|---|
| *H01L 23/48* | (2006.01) | |
| *H01L 21/768* | (2006.01) | |
| *H01L 23/485* | (2006.01) | |
| *H01L 23/532* | (2006.01) | |

(52) U.S. Cl.
CPC .. *H01L 21/76895* (2013.01); *H01L 21/76805* (2013.01); *H01L 21/76846* (2013.01); *H01L 21/76889* (2013.01); *H01L 23/485* (2013.01); *H01L 23/53238* (2013.01); *H01L 23/53266* (2013.01)

(58) Field of Classification Search
CPC ............. H01L 23/535; H01L 21/76846; H01L 21/76889; H01L 21/76895; H01L 23/5283; H01L 23/53266
USPC ........ 257/412, 413, 751, 753, 763, 764, 774
See application file for complete search history.

(56) References Cited

U.S. PATENT DOCUMENTS

| | | | | |
|---|---|---|---|---|
| 6,191,027 B1 * | 2/2001 | Omura | ............... | H01L 21/76807 257/E21.579 |
| 6,278,164 B1 * | 8/2001 | Hieda | ................. | H01L 29/4983 257/295 |
| 8,193,641 B2 | 6/2012 | Rachmady | | |
| 8,466,556 B2 | 6/2013 | Park | | |

* cited by examiner

*Primary Examiner* — Hung Vu
(74) *Attorney, Agent, or Firm* — Winston Hsu (57) ABSTRACT

A semiconductor process for forming a plug includes the following steps. A dielectric layer having a recess is formed on a substrate. A titanium layer is formed to conformally cover the recess. A first titanium nitride layer is formed to conformally cover the titanium layer, thereby the first titanium nitride layer having first sidewall parts. The first sidewall parts of the first titanium nitride layer are pulled back, thereby second sidewall parts being formed. A second titanium nitride layer is formed to cover the recess. Moreover, a semiconductor structure formed by said semiconductor process is also provided.

8 Claims, 6 Drawing Sheets

SEMICONDUCTOR STRUCTURE AND PROCESS FOR FORMING PLUG INCLUDING LAYER WITH PULLED BACK SIDEWALL PART

BACKGROUND OF THE INVENTION

1. Field of the Invention

The present invention relates generally to a semiconductor structure and process for forming a plug, and more specifically to a semiconductor structure and process applying a layers-pulling back process for forming a plug.

2. Description of the Prior Art

Field effect transistors are important electronic devices in the fabrication of integrated circuits, and as the size of the semiconductor device becomes smaller and smaller, the fabrication of the transistors also improves and is constantly enhanced for fabricating transistors with smaller sizes and higher quality. In the conventional method of fabricating transistors, agate structure is first formed on a substrate, and a lightly doped drain (LDD) is formed on the two corresponding sides of the gate structure. Next, a spacer is formed on the sidewall of the gate structure and an ion implantation process is performed to form a source/drain region within the substrate by utilizing the gate structure and spacer as a mask. In order to incorporate the gate, source, and drain into the circuit, contact plugs are often utilized for interconnection purposes. Each of the contact plugs include a barrier layer surrounding a low resistivity material to prevent the low resistivity material from diffusing outward to other areas. As the miniaturization of semiconductor devices increases, filling the barrier layer and the low resistivity into a contact hole has become an important issue to form the contact plug and maintaining or enhancing the performances of formed semiconductor devices as well.

SUMMARY OF THE INVENTION

The present invention provides a semiconductor structure and process for forming a plug, which pulls back layers formed in the plug to improve gap filling capability.

The present invention provides a semiconductor process for forming a plug including the following steps. A dielectric layer having a recess is formed on a substrate. A titanium layer is formed to conformally cover the recess. A first titanium nitride layer is formed to conformally cover the titanium layer, thereby the first titanium nitride layer having first sidewall parts. The first sidewall parts of the first titanium nitride layer are pulled back, thereby second sidewall parts being formed. A second titanium nitride layer is formed to cover the recess.

The present invention provides a semiconductor structure including a metal gate, a dielectric layer, a titanium layer, a first titanium nitride layer and a second titanium nitride layer for forming a plug. The metal gate is disposed on a substrate. The dielectric layer having a recess is located on the substrate beside the metal gate. The titanium layer conformally covers the recess, thereby the titanium layer having sidewall parts. The first titanium nitride layer conformally covers the titanium layer, wherein the first titanium nitride layer has second sidewall parts, and top surfaces of the second sidewall parts are lower than a top surface of the dielectric layer. The second titanium nitride layer conformally covers the recess, the titanium layer and the first titanium nitride layer.

According to the above, the present invention provides a semiconductor structure and process for forming a plug, which forms a recess in a dielectric layer; sequentially covers a titanium layer and a first titanium nitride layer in the recess; pulls back the first titanium nitride layer; and then, covers a second titanium nitride layer in the recess, the titanium layer and the first titanium nitride layer. Due to the first titanium nitride layer being pulled back, the opening of the recess can be increased, and thus gap filling capability for forming the plug can be improved.

These and other objectives of the present invention will no doubt become obvious to those of ordinary skill in the art after reading the following detailed description of the preferred embodiment that is illustrated in the various figures and drawings.

DETAILED DESCRIPTION

The present invention is applied in a planar transistor in this embodiment, but the present invention can also be applied in a non-planar transistor such as a multi-gate MOSFET, depending upon practical requirements.

Figure 1:
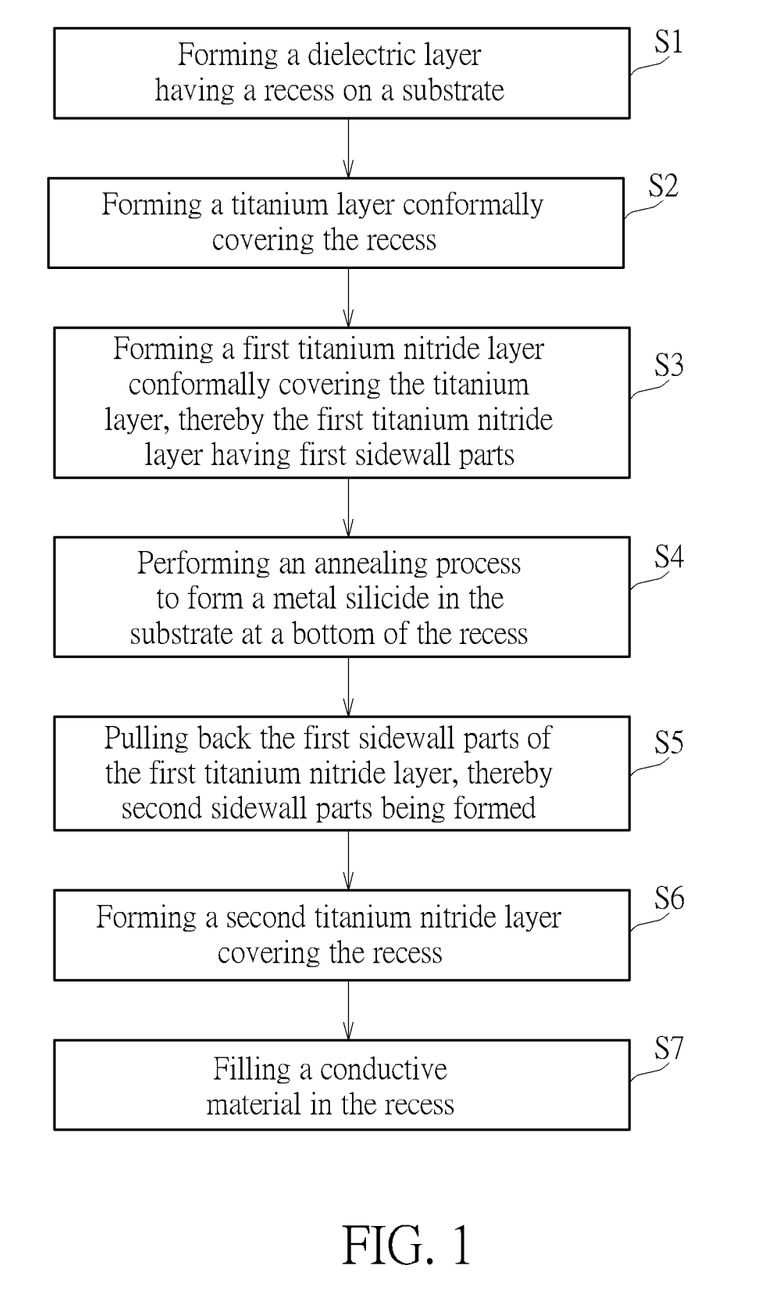
FIG. 1 schematically depicts a flow chart of a semiconductor process for forming a plug according to an embodiment of the present invention.

FIG. 1 schematically depicts a flow chart of a semiconductor process for forming a plug according to an embodiment of the present invention. FIGS. 2-10 schematically depict cross-sectional views of a semiconductor process for forming a plug according to an embodiment of the present invention. Please refer to a flowchart of the present invention in FIG. 1 and the corresponding cross-sectional views of the present invention in FIGS. 2-10 at the same time.

Figure 2:
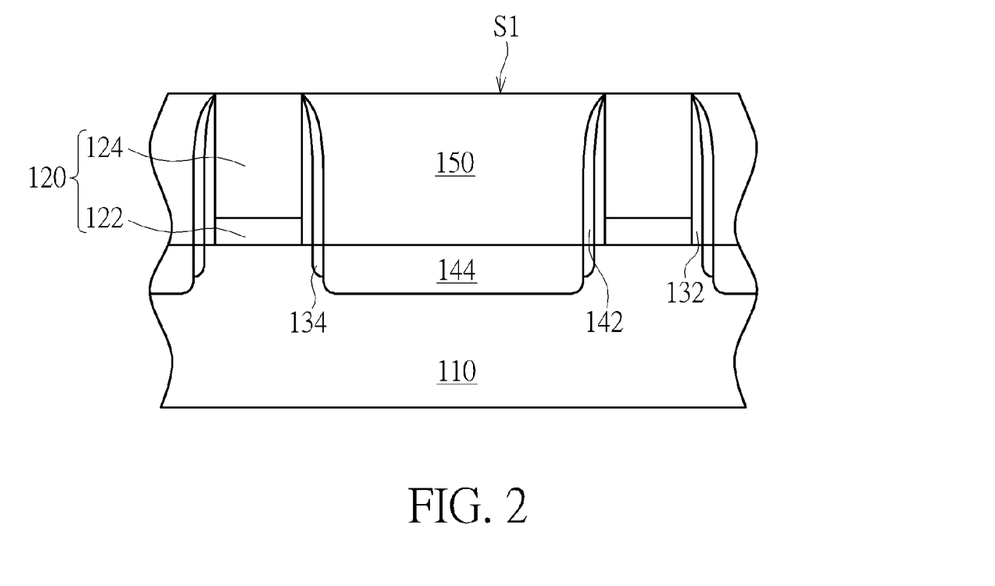
FIGS. 2-10 schematically depict cross-sectional views of a semiconductor process for forming a plug according to an embodiment of the present invention.
Figure 3:
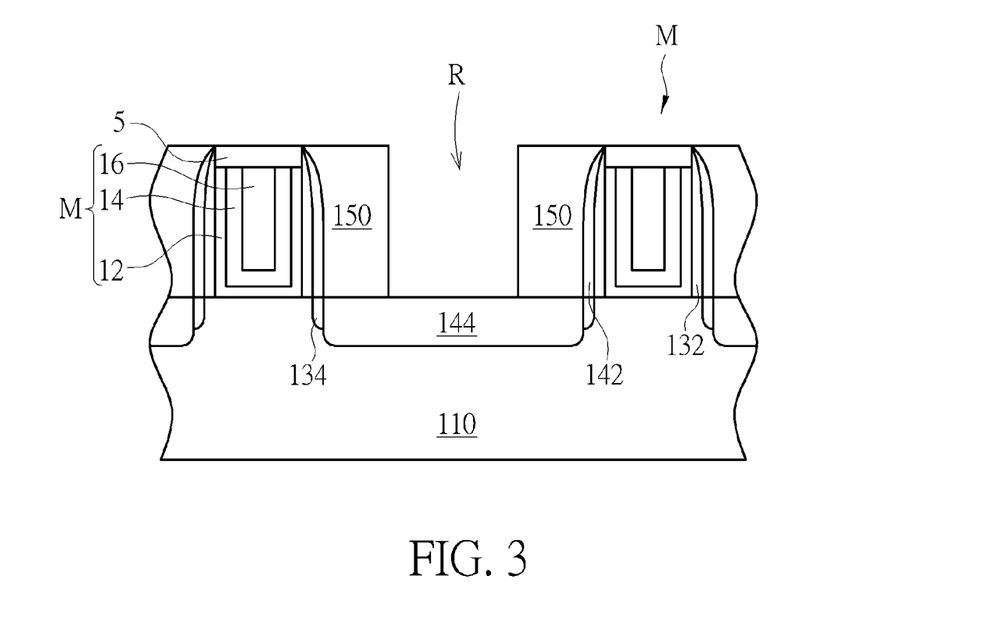

According to step S1 of FIG. 1—forming a dielectric layer having a recess on a substrate, please refer to FIGS. 2-3. As shown in FIG. 2, a substrate 110 is provided. The substrate 110 may be a semiconductor substrate such as a silicon substrate, a silicon containing substrate, a III-V group-on-silicon (such as GaN-on-silicon) substrate, a graphene-on-silicon substrate or a silicon-on-insulator (SOI) substrate. A plurality of isolation structures (not shown) may be formed in the substrate 110 to surround and isolate this depicted area from other areas. The isolation structures may be shallow trench isolation structures, which may be formed by a shallow trench isolation process, but they are not limited thereto. Two gates 120 are formed on the substrate 110. Each of the gates 120 may include a dielectric layer 122 and an electrode layer 124 from bottom to top, but it is not limited thereto. The dielectric layer 122 may be an oxide layer, which may be formed through a thermal oxide process or a chemical oxide process etc. The electrode layer 124 may be a silicon layer, a silicide layer or a metal layer. In this embodiment, a gate-last for high-K last process is applied, thus the electrode layer 124 is a sacrificial electrode layer, which may be replaced by a metal gate through a replacement metal gate (RMG) process later. In addition, the present invention can also be applied in a gate-last for high-K first process, a gate first process, a polysilicon gate process or other semiconductor processes in other embodiments. For simplifying and clarifying the present invention, only two gates 120 are depicted in the figures, but the number of the gates 120 is not restricted thereto. In another embodiment, the number of the gates 120 may be one or more than two.

An offset (not shown) may be optionally formed on the substrate 110 beside each of the gates 120, wherein the offset (not shown) may be a nitride layer, an oxide layer or an oxynitride layer etc. A first spacer 132 is formed on the substrate 110 beside each gate 120 to define the positions of lightly doped source/drains in the substrate 110 beside the first spacers 132. Two lightly doped source/drains 134 are then formed in the substrate 110 beside the two first spacers 132 respectively, wherein the dopants of the lightly doped source/drains 134 may be trivalent ions such as boron or pentavalent ions such as phosphorus, depending upon practical needs. Then, a main spacer 142 may be formed on the substrate 110 beside each first spacer 132. The main spacer 142 may be a single layer spacer or a multilayer spacer, and its cross-sectional profile depends upon practical needs and processing steps. In this embodiment, the main spacer 142 is a single layer. A source/drain 144 is formed in the substrate 110 beside each of the main spacers 142, wherein the dopants of the source/drains 144 may be trivalent ions such as boron or pentavalent ions such as phosphorus, depending upon practical needs.

Thereafter, a contact etch stop layer (not shown) may be formed to cover the gates 120 and the substrate 110. The contact etch stop layer may be a nitride layer or a doped nitride layer having a capability of inducing stresses in the substrate 110 under the gates 120, but it is not limited thereto. A dielectric layer 150 is formed in the substrate 110 beside the gates 120. In this embodiment, the dielectric layer is an interdielectric layer, but it is not limited thereto. The dielectric layer 150 having a flat surface S1 may be formed by blanketly covering a dielectric layer (not shown) on the substrate and the gates 120, and then the dielectric layer is planarized to form the dielectric layer 150. The contact etch stop layer may also be planarized while the dielectric layer is planarized.

As shown in FIG. 3, metal gates M are formed to replace the gates 120 by processes such as a replacement metal gate (RMG) process, and caps 5 may cover the metal gates M. More precisely, the gates 120 are removed by processes such as an etching process, thereby two recesses (not shown) are formed; then, multi-metal layers fill into the recesses, such that a selective buffer layer (not shown), a dielectric layer having a high dielectric constant 12, a selective barrier layer (not shown), a work function layer 14 and a low resistivity material 16 may be formed in and fill each of the recesses, thereby forming the metal gates (not shown). More precisely, the step of forming the metal gates (not shown) may include the following steps. A selective buffer layer (not shown), a dielectric layer having a high dielectric constant (not shown), a selective barrier layer (not shown), a work function layer (not shown) and a low resistivity material (not shown) are sequentially formed to cover the two recesses and the dielectric layer 150 entirely; then, the low resistivity material (not shown), the work function layer (not shown), the selective barrier layer (not shown), the dielectric layer having a high dielectric constant (not shown) and the selective barrier layer (not shown) are planarized to form the two metal gates (not shown), but it is not limited thereto. Thereafter, the two metal gates (not shown) are etched back for the caps 5 to fill in, thus the metal gates M and the caps 5 thereon being completed.

The selective buffer layer may be an oxide layer, which may be a thermal oxide process or a chemical oxide process; the dielectric layer having a high dielectric constant 12 may be the group selected from hafnium oxide ($HfO_2$), hafnium silicon oxide ($HfSiO_4$), hafnium silicon oxynitride (HfSiON), aluminum oxide ($Al_2O_3$), lanthanum oxide ($La_2O_3$), tantalum oxide ($Ta_2O_5$), yttrium oxide ($Y_2O_3$), zirconium oxide ($ZrO_2$), strontium titanate oxide ($SrTiO_3$), zirconium silicon oxide ($ZrSiO_4$), hafnium zirconium oxide ($HfZrO_4$), strontium bismuth tantalite ($SrBi_2Ta_2O_9$, SBT), lead zirconate titanate ($PbZr_xTi_{1-x}O_3$, PZT) and barium strontium titanate ($Ba_xSr_{1-x}TiO_3$, BST); the selective barrier layer (not shown) may be a single layer or a stacked structure composed of titanium nitride (TiN) or tantalum nitride (TaN); the work function layer 14 may be a single layer or a multilayer structure, composed of titanium nitride (TiN), titanium carbide (TiC), tantalum nitride (TaN), tantalum carbide (TaC), tungsten carbide (WC), titanium aluminide (TiAl) or aluminum titanium nitride (TiAlN); the low resistivity material 16 may be composed of low resistivity materials such as aluminum, tungsten, titanium aluminum (TiAl) alloy, cobalt tungsten phosphide (CoWP); and the caps 5 may be composed of nitride, but the present invention is not restricted thereto.

Thereafter, the dielectric layer 150 is etched to form a recess R and to expose the source/drain 144 in the substrate 110, thereby a contact plug can being formed in the recess R. In this embodiment, the semiconductor process of the present invention for forming a plug is applied to form a contact plug, but the present invention can also be applied to form a via plug, which will be formed directly above each of the metal gates M or the contact plug in later processes. Furthermore, the semiconductor process of the present invention for forming a plug can be applied in a self-aligned contact (SAC) process instead.

Figure 4:
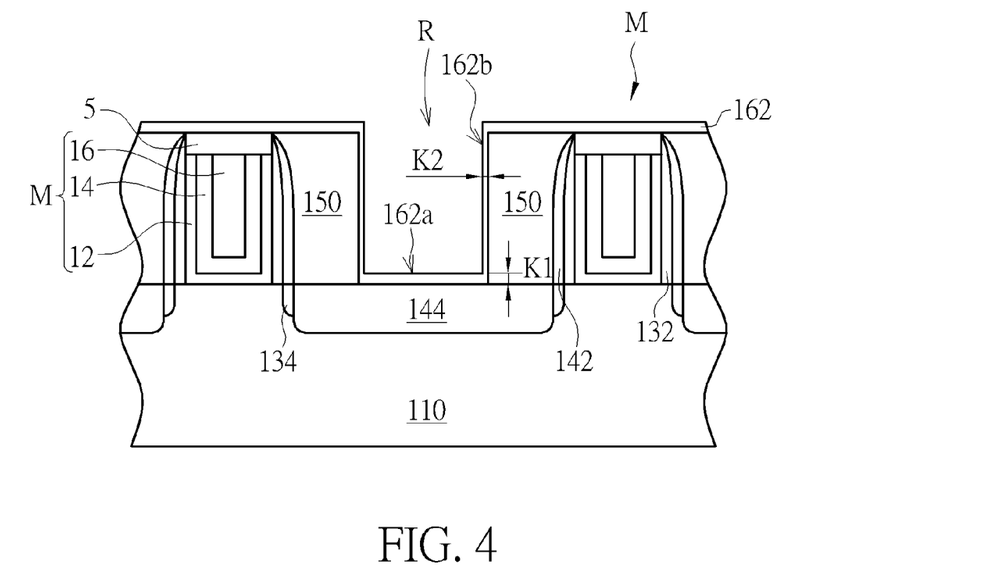

According to step S2 of FIG. 1—forming a titanium layer conformally covering the recess, please refer to FIG. 4. A pre-cleaning process (not shown) may be optionally performed to clean surfaces in the recess R. Then, a titanium layer 162 is formed to conformally cover the recess R and the dielectric layer 150. The titanium layer 162 thus has one bottom part 162a and two sidewall parts 162b. The bottom part 162a of the titanium layer 162 directly contacts the source/drain 144. In this embodiment, the titanium layer 162 is formed by a physical vapor deposition (PVD) process, therefore the bottom part 162a has a thickness k1 4-8 times thicknesses k2 of the sidewall parts 162b, but it is not limited thereto. In one case, the thickness k1 of the bottom part 162a may be 80 angstroms while the thicknesses k2 of the sidewall parts 162b are 10-20 angstroms.

Figure 5:
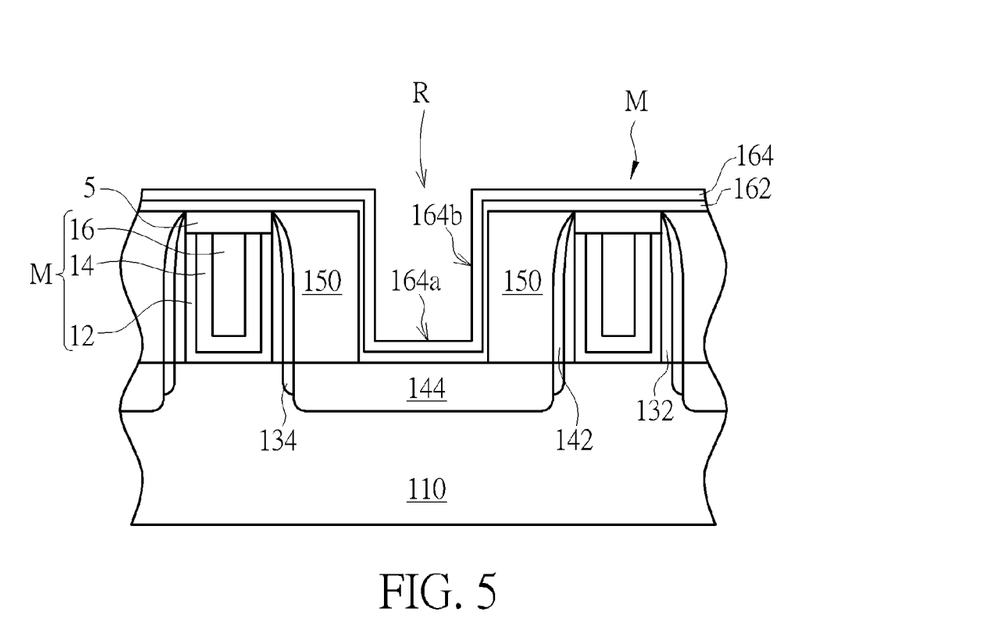

According to step S3 of FIG. 1—forming a first titanium nitride layer conformally covering the titanium layer, thereby the first titanium nitride layer having first sidewall parts, please refer to FIG. 5. A first titanium nitride layer 164 is formed to conformally cover the titanium layer 162, thereby the first titanium nitride layer 164 has a first bottom part 164a and two first sidewall parts 164b. In this embodiment, the first titanium nitride layer 164 is formed by a chemical vapor deposition (CVD) process, but it is not limited thereto.

Figure 6:
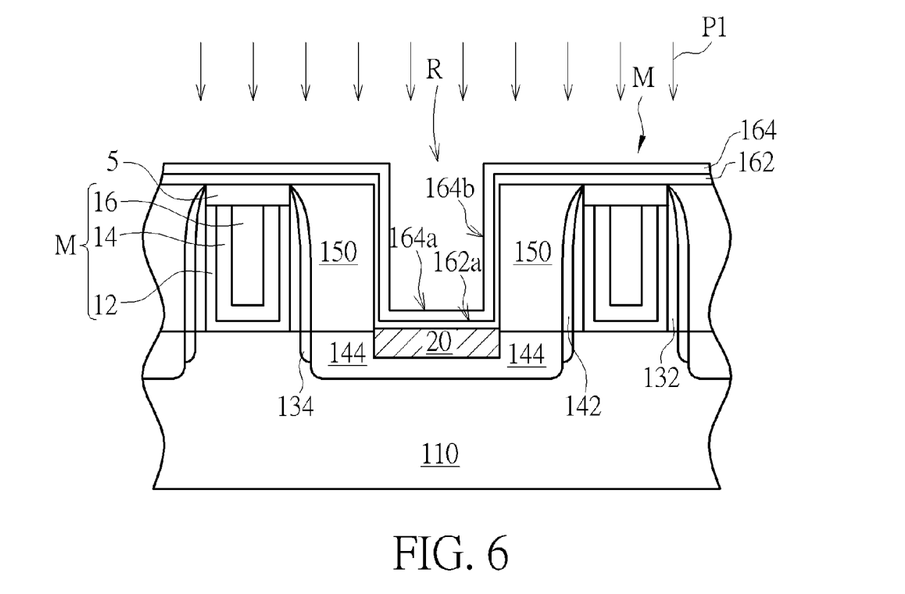

According to step S4 of FIG. 1—performing an annealing process to form a metal silicide in the substrate at a bottom of the recess, please refer to FIG. 6. An annealing process P1 is performed. Due to the substrate 110 at a bottom of the recess R being exposed while the recess R is formed, a metal silicide 20 in the substrate 110 at the bottom of the recess R, that is, in the source/drain 144 of the substrate 110, can be formed through the annealing process P1. The metal silicide 20 can be formed from reacting the bottom part 162a with the source/drain 144. In this embodiment, there is at least a part of the bottom part 162a reserved after the metal silicide 20 is formed. In another embodiment, the whole bottom part 162a may react with the source/drain 144 to form the metal silicide 20.

Figure 7:
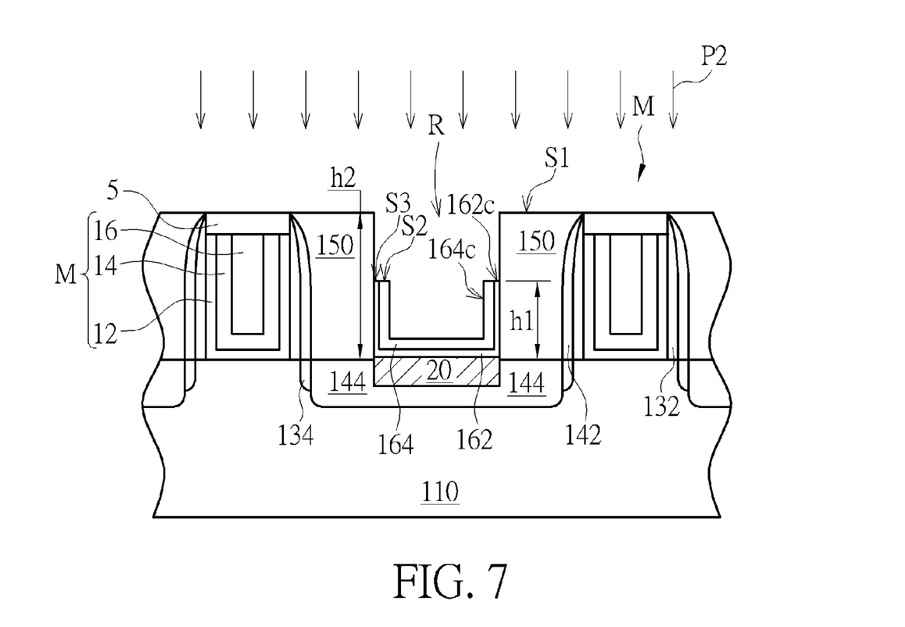

According to step S5 of FIG. 1—pulling back the first sidewall parts of the first titanium nitride layer, thereby second sidewall parts being formed, please refer to FIG. 7. The first sidewall parts 164b of the first titanium nitride layer 164 are pulled back by processes such as an etching process P2 to form second sidewall parts 164c, thereby top surfaces S2 of the second sidewall parts 164c are lower than the top surface S1 of the dielectric layer 150. The etching process P2 is a wet etching process in this case, but the etching process P2 may include a dry etching process, a dry etching process and a wet etching process, or others. Preferably, the second sidewall parts 164c have heights h1 0.4-0.6 times a height h2 of the recess R. Hence, a conductive material can fill the recess R easily in later processes.

It is noted that, the titanium layer 162 is also pulled back while the first sidewall parts 164b are pulled back in this embodiment, thereby the titanium layer 162 having sidewall parts 162c, so that gap filling such as a later filling conductive material processing step can be improved. Preferably, the sidewall parts 162c of the titanium layer 162 have top surfaces S3 trimmed with the top surfaces S2 of the second sidewall parts 164c. That is, as the second sidewall parts 164c have the heights h1 0.4-0.6 times the height h2 of the recess R, the sidewall parts 162c of the titanium layer 162 also have heights h1 0.4-0.6 times the height h2 of the recess R.

In this embodiment, the annealing process P1 of FIG. 6 is performed after the first titanium nitride layer 162 is formed and before the first sidewall parts 164b of the first titanium nitride layer 164 are pulled back, but the present invention is not restricted thereto. In another embodiment, the annealing process P1 of FIG. 6 may be performed after the first sidewall parts 164b of the first titanium nitride layer 164 are pulled back.

Figure 8:
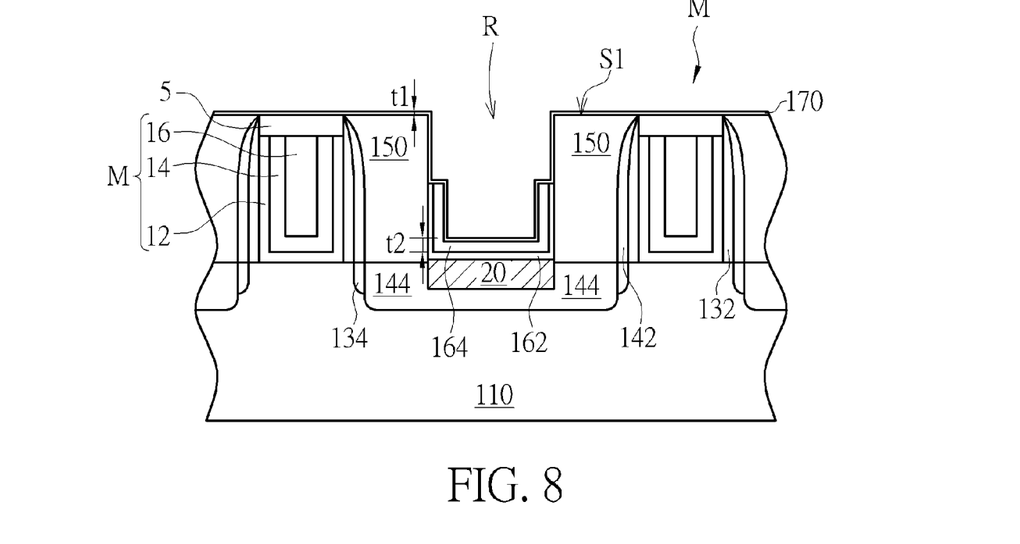

According to step S6 of FIG. 1—forming a second titanium nitride layer covering the recess, please refer to FIG. 8. A second titanium nitride layer 170 is formed by an atomic layer deposition (ALD) process to cover the recess R, the titanium layer 162 and the first titanium nitride layer 164 in this embodiment, for serving as a seeding layer and a barrier layer for protecting below layers such as the titanium layer 162 and the first titanium nitride layer 164. Thus, the second titanium nitride layer 170 can have a thickness t1 less than a thickness t2 of the first titanium nitride layer 164 as the second titanium nitride layer 170 is formed by an atomic layer deposition (ALD) process while the first titanium nitride layer 164 is formed by a chemical vapor deposition (CVD) process. Preferably, the second titanium nitride layer 170 can have the thickness t1 less than one third the thickness t2 of the first titanium nitride layer 164. In one case, the thickness t1 of the second titanium nitride layer 170 may be 10 angstroms while the thickness t2 of the first titanium nitride layer 164 is 30-40 angstroms. In another embodiment, the annealing process P1 of FIG. 6 may be performed after the second titanium nitride layer 170 is formed instead.

It is emphasized that, by pulling back the first titanium nitride layer 164 and forming the second titanium nitride layer 170 by an atomic layer deposition (ALD) process, which has improved stage coverage, the second titanium nitride layer 170 has a step cross-sectional profile in the recess R. Thus, later gap filling process for filling a conductive material (not shown) in the recess R can be improved.

Figure 9:
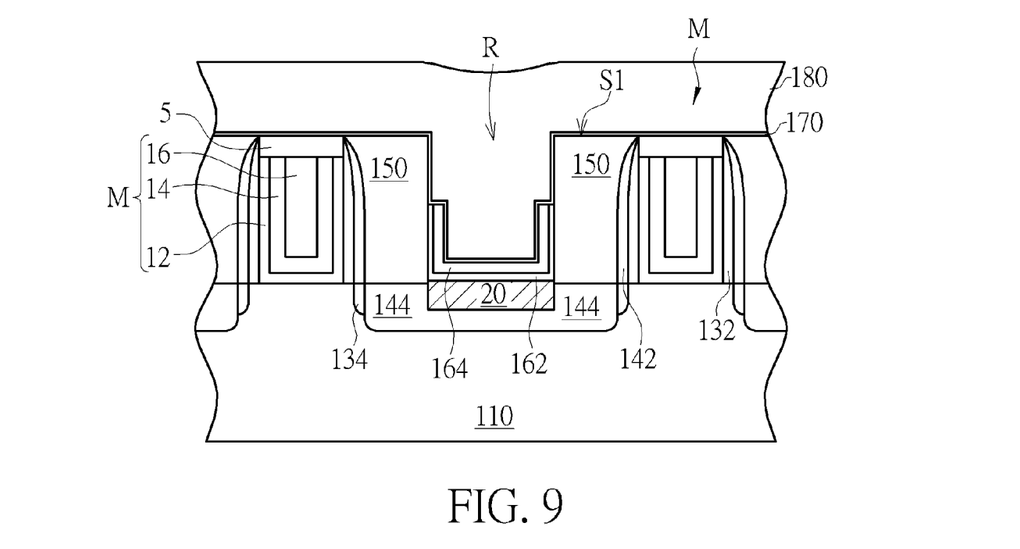
Figure 10:
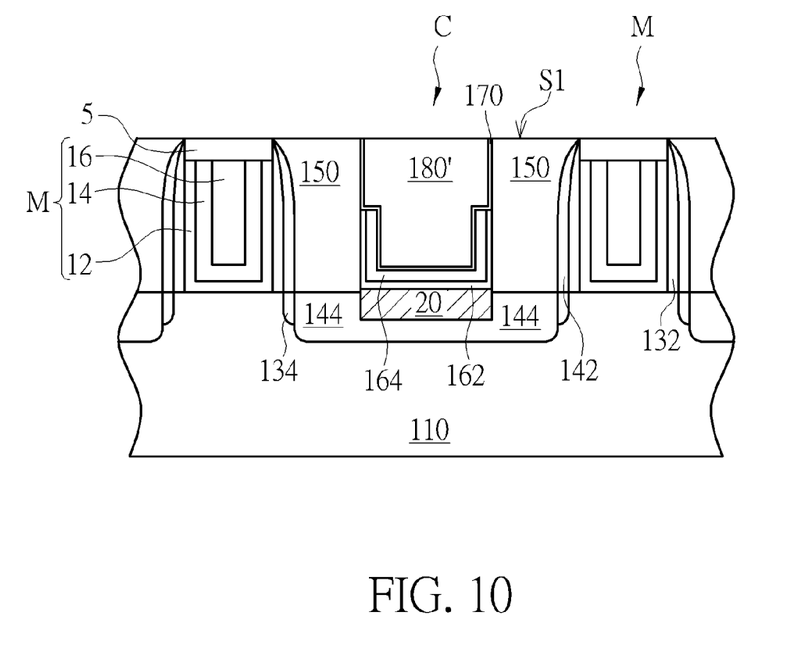

According to step S7 of FIG. 1—filling a conductive material in the recess, please refer to FIGS. 9-10. As shown in FIG. 9, a conductive material 180 fills in the recess R; and then, the conductive material 180 is planarized until the dielectric layer 150 is exposed to form a conductive material 180', therefore the conductive material 180' has a T-shaped cross-sectional profile in the recess R, as shown in FIG. 10. A contact plug C is thus constituted. The conductive material 180 may be composed of copper, tungsten or others.

Accordingly, the present invention is applied to form the contact plug C in this embodiment, but the present invention can also be applied in a via plug, a metal line or a dual-damascene structure. For instance, an inter-metal dielectric (IMD) layer (not shown) may blanketly cover the dielectric layer 150, the contact plug C, or patterns such as metal lines; recesses are formed in the inter-metal dielectric layer; and then, via plugs formed by the semiconductor process of the present invention can be formed in the recesses, but it is not limited thereto. As the present invention is applied in a via plug, the annealing process P1 is not performed for forming a metal silicide.

To summarize, the present invention provides a semiconductor structure and process for forming a plug, which forms a recess in a dielectric layer; sequentially covers a titanium layer and a first titanium nitride layer in the recess; pulls back the first titanium nitride layer; covers a second titanium nitride layer in the recess, the titanium layer and the first titanium nitride layer; and then, fills a conductive material in the recess, thereby the plug can be constituted. Due to the first titanium nitride layer being pulled back, gap filling capability of the conductive material can be improved.

Moreover, the first titanium nitride layer is pulled back to have second sidewall parts, which have top surfaces lower than a top surface of the dielectric layer. Thus, the second titanium nitride layer can have a step cross-sectional profile in the recess, and the conductive material can inherently have a T-shaped cross-sectional profile in the recess. Preferably, the second sidewall parts have heights 0.4-0.6 times a height of the recess to have better gap filling. In an embodiment, the titanium layer may be optionally pulled back while the first titanium nitride layer is pulled back to have better gap filling. Top surfaces of the titanium layer are preferably trimmed with the top surfaces of the second sidewall parts.

Preferably, the first titanium nitride layer is formed by a chemical vapor deposition (CVD) process while the second titanium nitride layer is formed by an atomic layer deposition (ALD) process, so that the thickness of the second titanium nitride layer serving as a seed layer and a barrier layer can be less than the thickness of the first titanium nitride layer, which is pulled back and does not affect the opening of the recess. In one case, the thickness of the second titanium nitride layer is less than one third the thickness of the first titanium nitride layer.

Furthermore, an annealing process may be optionally performed after the first titanium nitride layer is formed and before the first titanium nitride layer is pulled back to form a metal silicide in the substrate at a bottom of the recess, which is exposed while the recess is formed.

Those skilled in the art will readily observe that numerous modifications and alterations of the device and method may be made while retaining the teachings of the invention.

Accordingly, the above disclosure should be construed as limited only by the metes and bounds of the appended claims.

What is claimed is:

1. A semiconductor structure for forming a plug, comprising:
   a metal gate disposed on a substrate;
   a dielectric layer having a recess located on the substrate beside the metal gate;
   a titanium layer conformally covering surfaces of the recess, thereby the titanium layer having sidewall parts;
   a first titanium nitride layer conformally covering the titanium layer, wherein the first titanium nitride layer has second sidewall parts, and top surfaces of the second sidewall parts are lower than a top surface of the dielectric layer; and
   a second titanium nitride layer conformally covering surfaces of the recess, the titanium layer and the first titanium nitride layer; and
   a conductive material filling up the recess and on the second titanium nitride layer.

2. The semiconductor structure for forming a plug according to claim 1, wherein the plug comprises a contact plug or a via plug.

3. The semiconductor structure for forming a plug according to claim 1, further comprising:
   a metal silicide disposed in the substrate at a bottom of the recess.

4. The s semiconductor structure for forming a plug according to claim 1, wherein the second titanium nitride layer has a step cross-sectional profile in the recess.

5. The semiconductor structure for forming a plug according to claim 1, wherein the second sidewall parts have heights 0.4-0.6 times a height of the recess.

6. The semiconductor structure for forming a plug according to claim 1,
   wherein the conductive material has a T-shaped cross-sectional profile in the recess.

7. The semiconductor structure for forming a plug according to claim 1, wherein the sidewall parts of the titanium layer has top surfaces trimmed with the top surfaces of the second sidewall parts.

8. The semiconductor structure for forming a plug according to claim 1, wherein the second titanium nitride layer has a thickness less than one third a thickness of the first titanium nitride layer.

* * * * *